United States Patent [19]

Schultheiss et al.

[11] Patent Number: 4,927,513

[45] Date of Patent: May 22, 1990

[54] METHOD AND ARRANGEMENT FOR FABRICATING MAGNETO-OPTICAL, STORABLE, AND/OR DELETABLE DATA CARRIERS

[75] Inventors: Eberhard Schultheiss, Herborn; Peter Wirz, Waldernbach, both of Fed. Rep. of Germany

[73] Assignee: Leybold Aktiengesellschaft, Fed. Rep. of Germany

[21] Appl. No.: 294,734

[22] Filed: Jan. 6, 1989

[30] Foreign Application Priority Data

Jan. 9, 1988 [DE] Fed. Rep. of Germany ....... 3800449

[51] Int. Cl.$^5$ ............................................. C23C 14/54
[52] U.S. Cl. .......................... 204/192.13; 204/192.2; 204/298.03; 204/298.11; 204/298.2; 204/298.23
[58] Field of Search ........... 204/192.13, 192.2, 192.26, 204/298 MT, 298 MM, 298 MS, 298 SC

[56] References Cited

U.S. PATENT DOCUMENTS

| | | | |
|---|---|---|---|
| 3,336,154 | 8/1967 | Oberg et al. ............................. | 427/8 |
| 4,426,264 | 1/1984 | Munz et al. ........................ | 204/192.13 |
| 4,500,409 | 2/1985 | Boys et al. ............................ | 204/298 |
| 4,776,938 | 10/1988 | Abe et al. ......................... | 204/192.15 |

FOREIGN PATENT DOCUMENTS

| | | | |
|---|---|---|---|
| 0253344A2 | 1/1988 | European Pat. Off. ............ | 204/298 |
| 2735525A1 | 2/1979 | Fed. Rep. of Germany ...... | 204/298 |
| 3047113A1 | 7/1982 | Fed. Rep. of Germany ...... | 204/298 |
| 59-35098 | 2/1984 | Japan ............................. | 204/192.26 |

OTHER PUBLICATIONS

Hong, M. et al, "DC Magnetron- and Diode-Sputtered Polycrystalline Fe and Amorphous Tb(FeCo) Films: Morphology and Magnetic Properties", J. Appl. Phys., vol. 59, No. 2, 1986, pp. 551-556.

Kryder, M. H., "Summary Abstract: Magneto-Optic Recording Materials", J. Vac. Sci. Technol. A, vol. 4, No. 3, 1986, pp. 558-559.

Severin, H. G., "Sputtern, Die Erzeugung dunner Schichten", Physik in Unserer Zeit, 17, 1986, pp. 71–79.

Shieh, H. P. D., Dissertation, "Magneto-Optical Recording Media Fabrication, Characterization and Optimization", Carnegie-Mellon University, Pittsburgh, Pa., 1987, pp. 17-20.

*Primary Examiner*—Aaron Weisstuch
*Attorney, Agent, or Firm*—Limbach, Limbach & Sutton

[57] ABSTRACT

A method and apparatus for fabricating magneto-optical, storable, and/or deletable data carriers. One or more layers, each comprising two or more different chemical materials, are applied on a substrate (4) by means of a magnetron sputtering system (1). The fractional composition of each layer is controlled by changing the strength of the magnetic field produced by the magnetron system (1). By means of a suitable measuring device (51, 58) the compensation temperature of a particular layer is measured and compared with a desired value. If the measured compensation temperature differs from the desired value, the desired value can be attained by adjusting the cathode voltage $U_K$ of the magnetron system. A controller (63) is provided for controlling the cathode voltage and adjusting the distance between the magnetron system's target (6) and magnets (8, 9, 10).

27 Claims, 3 Drawing Sheets

METHOD AND ARRANGEMENT FOR FABRICATING MAGNETO-OPTICAL, STORABLE, AND/OR DELETABLE DATA CARRIERS

FIELD OF THE INVENTION

The invention relates to a method and apparatus for fabricating magneto-optical, storable, and/or deletable data carriers using different chemical materials, with these materials being applied as layers on a substrate by means of a magnetron sputtering system.

BACKGROUND OF THE INVENTION

Magneto-optical data storage combines the advantages of magnetic data storage (including the advantage that data can be deleted and newly written on the same carrier), with the advantages of the purely optical data storage (which include avoidance of unwanted data deletion after a crash of the data head onto the data carrier). In addition, with magnetic optical storage, very high storage densities can be achieved which are of the order of magnitude of $5 \times 10^8$ bits/cm$^2$ and which permit the manufacture of storage disks.

Magneto-optical storage relies upon the phenomenon that polarized light experiences a rotation of its plane of polarization in passing through a magnetic field (the Faraday Effect) as well as in reflecting from a ferromagnetic surface (the magneto-optical Kerr Effect). The magnitude of the rotation of the plane of polarization for a given material is a monotonic function of the magnetization. In order to achieve such polarization rotation, a magnetic layer may be sputtered on a substrate. The magnetic layer may consist primarily of binary, ternary or quaternary alloys of the elements of the group of rare earths ($^{59}$Pr-$^{70}$Yb) and the group of transition metals ($^{26}$Fe-$^{28}$Ni) (See Mark H. Kryder, *J. Vac. Sci. Technol.*, A4 (3), 1986, page 558). These alloys are applied in a dc or rf sputtering process (See Hong, Gyorgy, van Dover, Nakahara, Bacon, Gallagher, "DC magnetron and diode-sputtered polycrystalline Fe and amorphous Tb(FeCo) films: Morphology and magnetic properties," *J. Appl. Phys.* 59 (2), 1986, pages 551–556) in the form of an amorphous thin film on suitable substrates. Initially, a Curie and compensation temperature of the ferrimagnetic layer in the vicinity of 150° C. is aimed for. The magneto-optical Kerr effect, should be as large as possible. This means that the angle through which the light polarization is rotated, which depends on the orientation of magnetization of the reflecting region, should be large. With a laser the layer is heated to the region of the ferrimagnetic system compensation point and an orientation impressed upon it in a magnetic field. For reading out this information, laser light of markedly lower intensity and linear polarization is employed. The orientation is rotated as a consequence of the magneto-optical Kerr effect. The direction of rotation is determined with an analyzer; it contains the stored information (See Hans-Gerd Severin, "Sputtern, Die Erzeugung düinner Schichten," *Zeitschrift Physik in unserer Zeit*, 17, 1986 pages 71–79, and in particular pages 77 and 78). A big problem fabricating this type magneto-optical storage device is the oxidation sensitivity of the magnetic layer. The magnetic layer must therefore be protected by additional layers against corrosion and abrasion. Metal layers or dielectric layers, for example Al, AlN, or Si$_3$N$_4$, have been employed for this protective purpose.

While the starting materials of the alloys (i.e. the rare earths and the transition metals) have a ferromagnetic order, the alloys of these starting materials have a ferrimagnetic order (i.e. the rare earths and transition metals, which for their part are ferromagnetically ordered, couple mutually with each other antiferromagnetically).

The magnetization behavior of the alloy layers corresponds to that of soft magnets. Apart from a high squareness ($\sim$1) they have a strong magnetic anisotropy of ($k_u \sim 10^6$ ergs/cm$^3$) perpendicularly to the surface of the layer. Additional characteristic quantities for the magnetic behavior of thin layers of rare earth and transition metals are coercive field strengths H$_c$, for example at room temperature, compensation temperature T$_{comp}$, and Curie temperature T$_c$. The coercive field strength is here defined as that negative field strength H$_c$ which brings the magnetic flux density B again to zero. The Curie temperature T$_c$ is the temperature at which the ferromagnetic properties of a material vanish. Above the Curie temperature T$_c$, the spontaneous magnetization vanishes entirely and the previously ferromagnetic material behaves like a paramagnetic material. The compensation temperature T$_{comp}$ is that temperature at which the magnetization of an alloy is zero, specifically due to the addition of the positive magnetization of the one component of the alloy to the negative magnetization of another component of the alloy. At the compensation temperature T$_{comp}$ the magnetization likewise vanishes completely; however, the magnetic order of the individual materials is retained, in contrast to the behavior of these materials at the Curie temperature Since rare earth and transition metals differ with respect to direction of magnetization and also with respect to the temperature dependence of the magnetization magnitude, the magnetization of each overall alloy has a characteristic temperature dependence. It is therefore of great importance to determine or define the fractions of the rare earth and transition metals within an alloy. Sputter systems exist in which targets composed of plates of the individual elements (so-called "mosaic targets") are used in order to determine the rare earth and transition metal fractions in the alloy layers. As studies of such targets have shown, however, very often composition fluctuations due to fabrication conditions are found. In addition, as the target erodes, the particle radiation characteristic of the racetracks varies with different distribution of the individual elements in the plasma. These effects lead to fluctuations or to longterm drift of the fabricated function layers.

It is also conventional to determine the particular fractions of the starting materials by using appropriate sinter and alloy targets (See H. P. D. Shieh, Dissertation, Carnegie-Mellon University, Pittsburgh, CA {SIC: PA}, USA 1987). As investigations have shown, the temperature (and with it the room temperature-coercive field strengths) can be varied within certain limits by varying the sputter gas pressure and, in the case of diode sputtering, also by substrate biasing.

However, conventional sputtering methods have the disadvantage that changes in the processing pressure during magnetron sputtering lead to undesirable changes in the microstructure of the thin alloy layers. In addition, the specific rates in diode sputtering are comparatively low and very high target voltages are required. Furthermore, the application of a substrate bias in a production installation is technically difficult and, in the case of an rf bias, frequently leads to destabilization of the processes. In addition, since high concentrations of Ar atoms are built into the layers, the magnetic properties of the thus obtained alloy layers are not stable in the long term.

It is also conventional to change the relative position of magnet system and target plate continuously to make more uniform the consumption of target plates (See German Pat. Nos. DE-OS 27 35 525 and DE-OS 30 47 113 or U.S. Pat. No. 4,426,264). These conventional methods, however, do not allow precise determination of the composition of the alloys to be applied.

It is also known that the angular distribution of the emerging target atoms in multi-component targets can differ among the individual components, and that the installation geometry will influence the layer composition (*Physik in unserer Zeit*, loc.cit., pp. 74–75).

Further, a conventional sputtering cathode is suitable for magnetic as well as for non-magnetic target materials. This sputtering cathode permits coating of large areas by continuous processing of the substrates and leads to a very uniform layer thickness distribution, and yet can be operated with only a single current supply (See European Pat. Application 0 253 344 A2). This sputtering cathode has at least three magnet units, one within the other, and is equipped with a mechanical adjusting device by which the magnetic flux between a magnet yoke and at least one magnet unit can be varied relative to the magnetic flux between the magnet yoke and the remaining units.

Finally, a device for improving the electro-optical effect of a ferroelectric thin film is known which employs oxides of Pb, Ti, and La, wherewith the molar ratio of Pb to Ti is fixed within a specific range (See *Patent Abstracts of Japan*, June 8, 1984, Vol. 8, No. 122, JP-OS 59-35098). Herein powdered oxides of Pb, Ti, and La are mixed with each other, calcinated, and sputtered, with the powder serving as the target, in order to form a thin film on a substrate. The molar ratio of Pb to Ti is preferably $0.65 < Pb/Ti < 0.90$. The electro-optical effect of the resulting ferroelectric thin monocrystalline film is thereby improved and such film can be used as light-switching material.

SUMMARY OF THE INVENTION

The inventive method determines precisely the fractions of different alloy component materials which comprising layers applied on a substrate by a magnetron system. The invention controls the chemical composition of each layer by controlling the magnetron's magnetic field. The invention thus permits regulation of fluctuations and long-term drift in the composition of the fabricated magneto-optical ("MO") function layers which would otherwise limit utilization of the magnetic optical target.

In accordance with the invention, in the case that an alloy including a rare earth and a transition metal is sputtered on the substrate, attenuation of the magnetron cathode's magnetic field increases the rare earth fraction in the fabricated alloy layers. The composition of the fabricated layers is also a function of the magnetro's aperture diaphragm width. If for a given target composition the correlation of coercive field strength $H_c$ and temperature is known, the composition of the layer can be determined by measuring Hc by means of a Kerr magnetometer included in the inventive system. In accordance with the invention, the target composition is desirably selected so that the sputtered layer compensation temperature, $T_{comp}$, is equal to 300 K, a value desired by many users.

The invention also utilizes the fact that both the magnetron geometry, and the angular distribution of chemicals in the alloy target, affect the sputtered layer composition, and consequently, the magnetic properties of each layer. Thus, in accordance with the invention, the magnetic properties of a layer are detected immediately after the layer fabrication, and appropriate regulation is then performed. The cooperative variability of aperture diaphragm and field strength in the magnetron is an advantage of the invention. A further advantage of the invention is that it permits use of a target having a uniform composition over its entire surface, and hence a relatively long operating life. The invention does not require use of a non-uniform target, such as a ring target having rings composed of different materials.

BRIEF DESCRIPTION OF THE DRAWINGS

Exemplary embodiments of the invention are represented by the drawings, and are described in greater detail below.

DETAILED DESCRIPTION OF THE PREFERRED EMBODIMENTS

Figure 1:
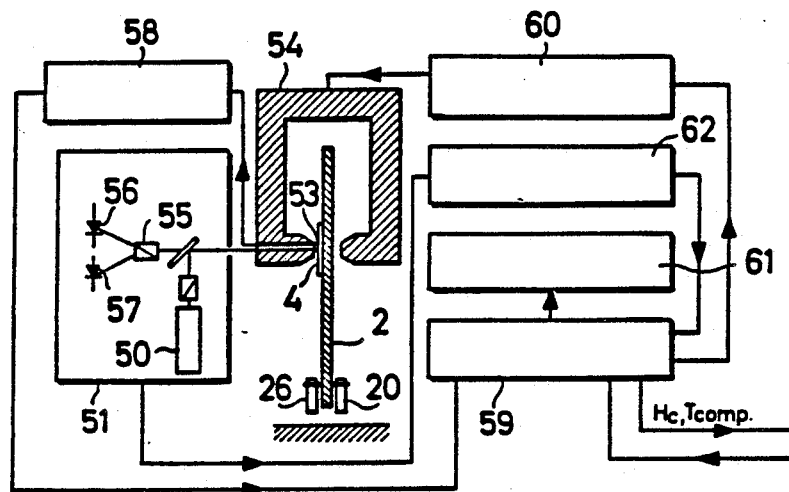
FIG. 1 shows a magnetron cathode with a magnetic field regulation device.
Figure 1:
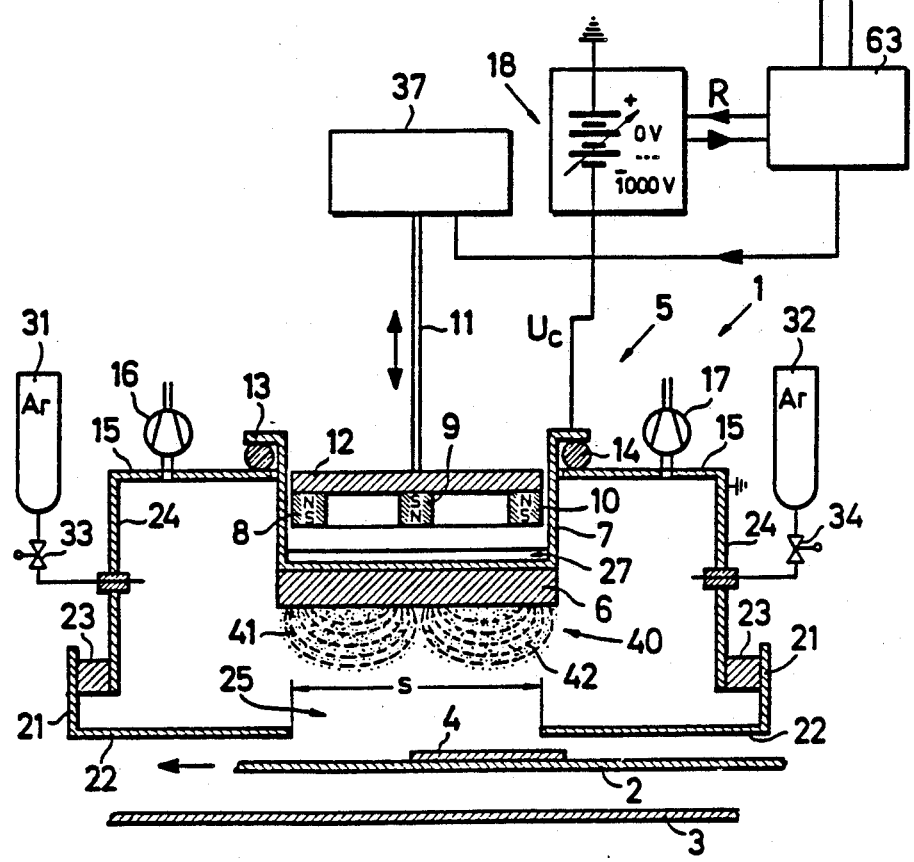

Magnetron cathode sputtering device 1 of FIG. 1 is arranged opposite a substrate carrier 2 behind which is located a screen 3. A substrate 4 to be coated is arranged on the substrate carrier 2. The cathode sputtering device 1 has a cathode configuration 5 which, in turn, includes the actual sputtering cathode 6 (or "target") and a cathode basin 7. Above the sputtering cathode 6 (which consists, for example, of an alloy of rare earths and transition metals) and in the cathode basin 7, permanent magnets 8, 9, and 10 are attached to a common yoke 12. On the bottom of the cathode basin 7 a cooling channel 27 for cooling the cathode is provided. Magnets 8, 9, and 10 on the yoke plate 12 are not cooled. They are in the ambient atmosphere.

It is contemplated that the cathode 6 may include binary, ternary or quaternary alloys including elements of the rare earth group ($^{59}$Pr-$^{70}$Yb) and elements of the transition metal group ($^{26}$Fe-$^{28}$Ni), and that the magnetron system will apply an amorphous thin film layer of these alloys on substrate 4. It is also contemplated that the magnetron system may be operated to apply a protective layer over such amorphous thin film layer, where the protective layer comprises a metal or dielectric material such as Al, AlN, or $Si_3N_4$.

The cathode basin 7 has a flange-shaped edge 13. An 0-ring insulator 14 is interposed between edge 13 and cover 15 of a cathode chamber which is at ground potential. One or more pumps 16 and 17 are also connected with this cover 15 via a large suction cross section which continuously evacuate the cathode chamber.

The cathode basin 7 is electrically connected to the negative pole of a variable dc voltage source 18 which supplies a dc voltage of approximately 0 to 1000 volts. Opposite the sputtering cathode 6 are two shanks 21 and 22 standing perpendicularly one upon the other, with shank 21 being connected via an electrically conducting connection piece 23 with one side wall 24 of the cathode chamber. Shanks 21 and 22 are therefore likewise at ground potential.

Shank 22 has an opening 25 of diameter S and, consequently, functions as a diaphragm. This diaphragm may be removed and replaced by another, for example, via the connection piece 23, and may be made adjustable with respect to its diameter S, by means not shown in detail in FIG. 1. The size S of the diaphragm opening 25 has an influence on the composition of the sputtered on alloy. The width S of the aperture diaphragm which is required must be preset in order to generate u compensation temperatures over the entire length of the cathode transversely to the direction of transport. This presetting is not changed during the sputtering operation. The gas required for the process comes from gas sources 31 and 32 and reaches the cathode chamber via control valves 33 and 34. Argon, for example, may be employed as the gas Cathode 6 preferably has a rectangular shape and a longest axis, and substrate 4 is preferably disk-shaped. Planar carrier 2 preferably transports substrate 4 horizontally (as shown in FIG. 1), in a direction perpendicular to the longest axis of cathode 6.

It is essential for the present invention to vary the magnetic field 40 of magnetron 1, which consists of the two partial fields 41 and 42. This variation is accomplished, for example, by variable magnet lifting system 37 connected to the cathode arrangement 5. Other means, however, may alternatively be employed for changing the magnetic field. The strength, but not the geometry, of magnetic field 40 is changed by varying the position of the permanent magnets 8, 9, and 10 by means of a rod 11 or the like relative to the surface of target 6. The magnetic field 40 of cathode 7 determines the voltage which is applied by the voltage source 18 to the cathode 7.

In order to maintain the fractions of the sputtered-on alloy at a constant ratio, the magnetic properties of the applied layers are continuously measured by means of a magnetometer.

For measuring these properties a special Kerr magnetometer 51, 58 is provided. For the sake of clarity, the Kerr magnetometer is shown in the upper part of Figure 1, even though it actually is arranged in the vicinity of the substrate carrier 2. The substrate carrier 2 with the substrate 4 is represented in both the upper and lower parts of FIG. 1.

The Kerr magnetometer consists of a head 51, a thermometer 58, and a measuring magnet 54. In the head 51 are a laser 50 and a light measuring device 55, 56, and 57. This Kerr magnetometer measures the Kerr magnetization curve of the produced alloy layer on substrate 4 at point 53. The carrier 2 is transported by two driving rollers 20, 26. The Kerr magnetometer 51 and 58 is controlled by a personal computer 59 which, via a current supply 60, changes the magnetic field of the measuring magnet 54 in preselectable steps. At each step, the Kerr rotation of polarized light originating from the laser 50 and reflected from a sample surface of the carrier 2 is registered by the personal computer 59. This registration takes place with the aid of a Woolaston prism 55 and two photodiodes 56, 57. From the electrical signal of diodes 56, 57 the degree of polarization of the measured light is determined by electronic circuitry 62. The sample temperature at point 53 is also simultaneously determined by optical thermometer 58, and personal computer 59 may process the measured signals to determine the compensation temperature from a fit for the coercive field strength. If these quantities are known, a conclusion regarding the composition of the alloy is possible. The value for the compensation temperature is supplied to a main computer 63 which compares the current value for Tcomp with a preset and desired value for the particular product. Regulation is subsequently performed, with the aid of the magnet lifting system (as described, for example, in German Pat. No. DE-OS 30 47 113 or U.S. Pat. No. 4,426,264), with the information shown in FIGS. 3, 4, and 5 (to be described below) being taken into account. Thus, magnet lifting system 37 changes the position of magnets 8, 9, and 10 to drive cathode 6 to the appropriate voltage. The target voltage is a measure of the strength of the magnetic field on the surface of the target.

With the aid of monitor 61, information important to the operating personnel is displayed. The information may include, for example, the following: the measured magnetization curves, the coercive field strength $H_c$, the Kerr angle, the operating state of the magnetometer, and possibly also data regarding an earlier production process.

It is the task of the electronic circuitry 62 to amplify the signals of the two photodiodes 56, 57 in the measuring head 51 and to form the quantity:

$$\frac{\text{intensity}_{diode\ 56} - \text{intensity}_{diode\ 57}}{\text{sum of the two intensities}}$$

which is a direct measure of the Kerr rotation of the sputtered layer computed in personal computer 59. Main computer 63 controls the entire coating system, and in particular, controls the cathode voltage through the 10 magnet lifting system as well as the cathode power density through the sputter current supply.

The above-mentioned dependencies between cathode voltage UK, on the one hand, and compensation temperature Tcomp, diaphragm gap width S, target erosion, and sputter rate SR, on the other hand, will be described in greater detail below with reference to FIGS. 2-5.

Figure 2:
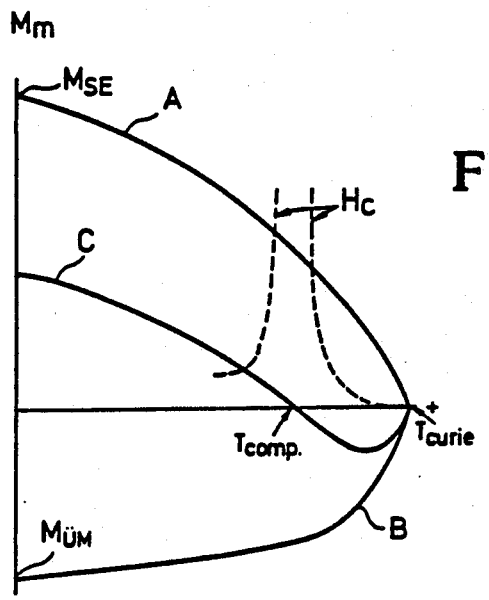
FIG. 2 is a graphic representation elucidating the magnetic behavior of rare earths, transition metals, and alloys made therefrom.

In FIG. 2, the magnetic moment is represented as a function of temperature. Curve A represents the behavior of the rare earths. It is evident from curve A that the magnetic moment of the rare earths at low temperatures assumes a positive value $M_{SE}$ which is very high and that this value decreases steadily with increasing temperature in order to assume the value zero at the Curie temperature $t_{curie}$.

Curve B represents the magnetic behavior of the transition metals. Here too the magnetic moment MUM increases from a relatively large (negative) value with increasing temperature to the value zero at the Curie temperature $T_{curie}$.

It is important that the magnetic moments of the rare earths and the transition metals have opposite signs. Due to this phenomenon, the overall behavior of the alloy below the compensation temperature $T_{comp}$ is dominated by the rare earths, and above such temperature is dominated by the transition metals. This overall alloy behavior, represented by curve C, is the behavior of ferrimagnetic systems. The alloy consequently exhibits, at $T_{comp}$, an external behavior like that at the Curie temperature $T_{curie}$, although the magnetic order of the domains of the individual alloy components is not yet destroyed at the temperature $T_{comp}$.

At the compensation temperature $T_{comp}$ the coercive field strength $H_c$ has a pole locus, i.e. it assumes on both sides of $T_{comp}$ the value infinity since at this temperature the magnetization vanishes, and the energy density $MS*H_c$, however, is retained. If the compensation temperature $T_{comp}$ is brought to the value of the ambient temperature (which may be 300 degrees K.), this means that at ambient temperature can be deleted. Because this is a desirable state, it is useful to select the composition of the alloy so that $T_{comp}$ corresponds to the ambient temperature.

The dependencies of the characteristic compensation temperatures $T_{comp}$ as well as the Curie temperature $T_{curie}$ of an alloy on the composition of the alloy are relatively steep. Thus, for example, in an embodiment of the invention in which a ternary alloy TbFeCo consisting of about 68% iron, about 8% cobalt, and about 24% terbium is applied to substrate 4, the compensation temperature for such ternary alloy is given by $$T_{comp} (°C.) = 25 + (X - 23) * 40$$

and the Curie temperature by $$T_{curie}(°C.) = 135 + 8 * y,$$

where x is the terbium, and y the cobalt fraction in atom percent in the layer composition.

This means that upon a change of the terbium or cobalt fractions in the layer by one atom percent the compensation temperature shifts by 40° C. or the Curie temperature by 8° C.

The sputtering behavior of magneto-optical targets depends on the effect that the individual elements of the target alloy have different angular distributions before the racetrack of the magnetron. The sputter particles of the rare earths are laterally extended more strongly, or more strongly concentrated in the center, than are the transition metals. If the surrounding geometry is appropriately adapted to the cathode, outer parts of the particle flow to the substrate can be blocked out. Since a change of the magnetic field of the cathode changes the plasma geometry, the blocked out part can be controlled. Since the layer composition varies accordingly, this phenomenon is the foundation of the control principle employed in performing the invention.

Figure 3:
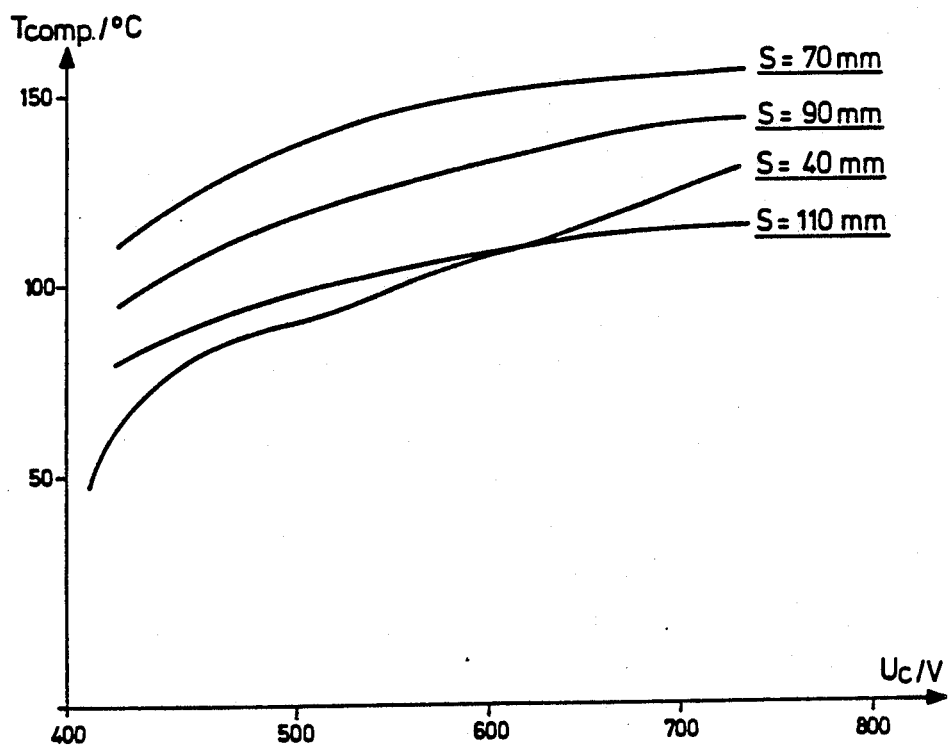
FIG. 3 is a graph of compensation temperature as a function of cathode voltage, and of the width S of an aperture diaphragm for a new target.

FIG. 3 represents the compensation temperature $T_{comp}$ for a $Tb_{.2.4}Fe_{6.8}Co_{0.08}$ target as a function of the target or cathode voltage $U_K$ (represented herein as $U_C$), with the different curves representing different widths S of the opening 25 (shown in FIG. 1). It can be seen from FIG. 3 that the compensation temperature Tcomp increases with increasing target voltage as well as with decreasing gap width S. In FIG. 3, a fresh target is always assumed. FIG. 3, further, shows that a change of the magnetic field of the magnetron cathode 6 leads to smaller field strengths which is indicated by higher cathode voltages. This, in turn, leads to an increase of the rare earth fraction in the fabricated alloy. Since the magnetic field strength's compensation temperature characteristic is also a function of the aperture diaphragm width S, by changing this aperture diaphragm width S coarse control of the compensation temperature of the fabricated alloy layers is possible, while changing the magnetic field permits finer control. At a given sputtering or cathode voltage a different compensation temperature results for each gap width. If the normal regulating range is exhausted, it is possible to change optionally to another diaphragm width S. Since the cathode voltage is a measure of the strength of the magnetic field on the target surface, the voltage axis of FIG. 3 can also be seen as the magnetic field strength axis.

Figure 4:
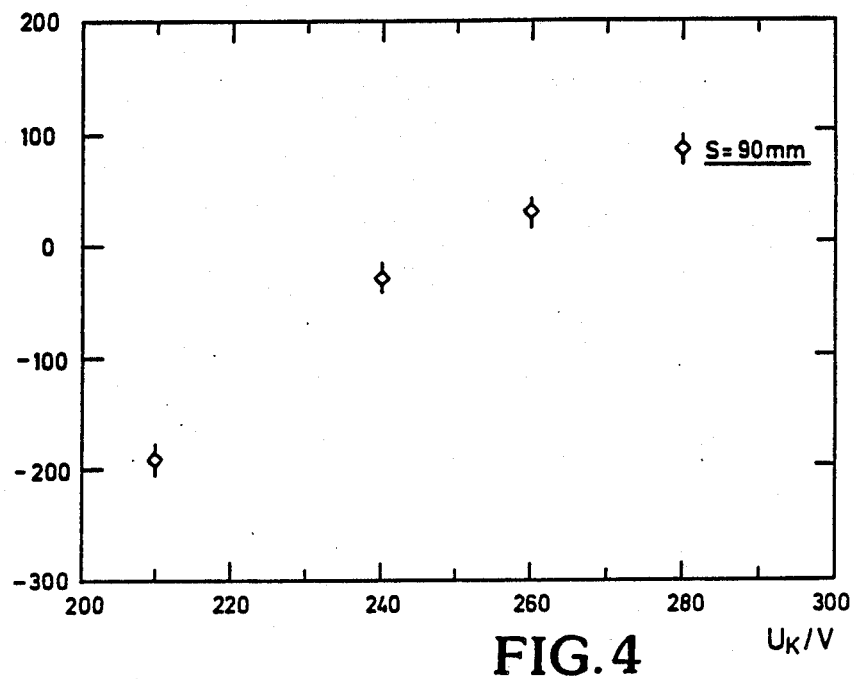
FIG. 4 is a graph of compensation temperature as a function of cathode voltage for an eroding target.

FIG. 4 shows the compensation temperature Tcomp as a function of the cathode voltage $U_K$ at constant gap S of screen 22 and with an eroding target. The target erosion is here assumed to be 50%. In the course of target erosion the dependence of the compensation temperature $T_{comp}$ on the cathode voltage $U_K$ changes. In contrast with FIG. 3, all the data shown in FIG. 4 does not represent a fresh target. The practical consequence of this effect is that it is, in fact, necessary to measure and readjust the operating parameters of the inventive system continuously during production. Compared to methods in which regulation is performed only on the basis of the actual cathode voltage, such continuous regulation also accounts for target erosion, and can result in significant extension of the target operating life. This is very important because magneto-optical targets are very expensive.

Figure 5:
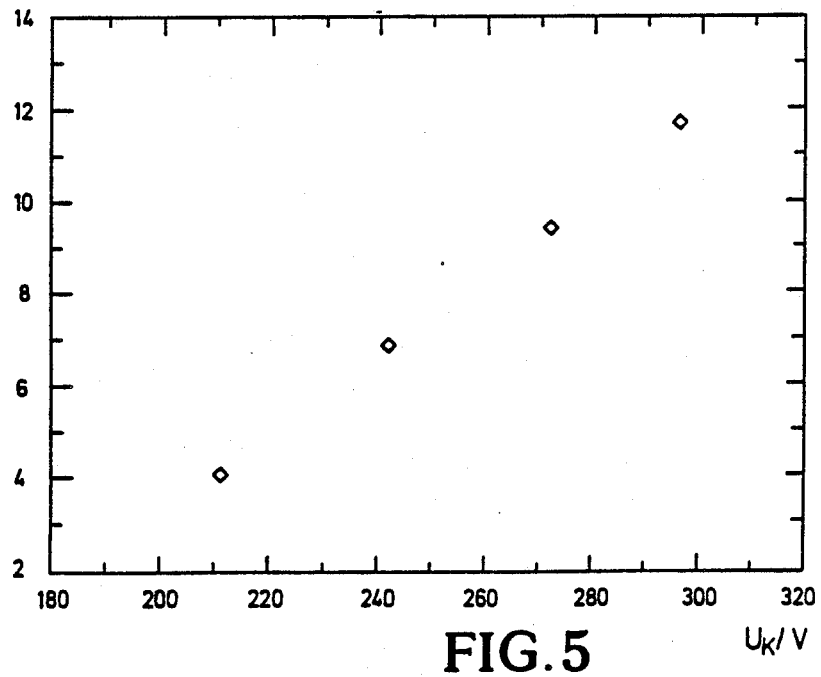
FIG. 5 is a graph of sputter rate as a function of cathode voltage.

In FIG. 5 the specific sputter rate as a function of the cathode voltage $U_K$ is represented. It can be seen that the specific sputter rate increases with increasing voltage. The change of the magnetic field of the magneto-optical cathode leads, consequently, also to a change of the specific sputter rate. But since a change of the energy density on the target 6 (i.e. at fixed cathode voltage of the cathode current) does not change the magnetic properties of the alloy layers, this problem can be accounted for by readjusting the cathode current by means of the main computer 63.

It is also conceivable to represent the compensation temperature as a function of the displacement of the magnet lifting system. This, however, would lead to a very complex representation because the cathode constructions are also quite different. Since, however, a proportional relationship exists between the sputtering or cathode voltage and the spindle setting or the distance of magnets 8, 9, and 10 from the original surface of target 6, and since the cathode voltage can be measured very reliably during the sputtering operation (as described for example in U.S. Pat. No. 4,426,264), the cathode voltage was selected as the o variable. To the extent the value of the cathode voltage is kept constant through regulation, a constant compensation temperature is also obtained. This applies also for different magnetron cathode constructions.

Depending on whether or not the compensation temperature measured by means of the magnetometer within a vacuum coating system corresponds to the desired value, the inventive method includes the step of determining (in conjunction with a diagram or by means of a computer) whether (and if so, in which direction) the cathode voltage must be changed. Any necessary adjustment is performed using the controller by adjusting the magnet distance. This is a closed control loop.

We claim:

1. A method for fabricating a magneto-optical, storable, and/or deletable data carrier, including the steps of:

operating a magnetron sputtering system (1) to apply a layer comprising different magnetic materials, with different specific weights, on a substrate (4), wherein the magnetron system (1) produces a magnetic field; and controlling the chemical composition of the layer by controlling the magnetic field of the magnetron system (1).

2. The method of claim 1, wherein the layer comprises an alloy selected from the group consisting of binary, ternary, and quaternary alloys including elements of the rare earth group, $^{59}Pr$-$^{70}Yb$, and elements of the transition metal group, $^{26}Fe$-$^{28}Ni$.

3. The method of claim 2, wherein the alloy consists of about 68% iron, about 8% cobalt, and about 24% terbium.

4. The method of claim 1, wherein the layer is an amorphous thin film layer.

5. The method of claim 4, also including the step of: applying a protective layer over the amorphous thin film layer, said protective layer comprising a chemical material selected from the group consisting of Al, AlN, and $Si_3N_4$.

6. A method for fabricating a magneto-optical, storable, and/or deletable data carrier, including the steps of:

operating a magnetron sputtering system (1) to apply a layer comprising different magnetic materials, with different specific weights, on a substrate (4), wherein the magnetron system (1) has an aperture diaphragm (22) of variable size (S); and controlling the chemical composition of the layer by changing the size (S) of the aperture diaphragm (22).

7. The method of claim 6, wherein the layer comprises an alloy selected from the group consisting of binary, ternary, and quaternary alloys including elements of the rare earth group, $^{59}Pr$-$^{70}Yb$, and elements of the transition metal group, $^{26}Fe$-$^{28}Ni$.

8. The method of claim 7, wherein the alloy consists of about 68% iron, about 8% cobalt, and about 24% terbium.

9. The method of claim 6, wherein the layer is an amorphous thin film layer.

10. The method of claim 9, also including the step of: applying a protective layer over the amorphous thin film layer, said protective layer comprising a chemical material selected from the group consisting of Al, AlN, and $Si_3N_4$.

11. The method of claim 6, wherein the magnetron sputtering system (1) also has a cathode (6, 7), and wherein the aperture diaphragm (22) is positioned near to the cathode (6,7).

12. An apparatus for fabricating a magneto-optical, storable, and/or deletable data carrier, including the steps of:

a magnetron sputtering system (1) for applying a layer comprising different chemical materials, with different specific weights, on a substrate (4), wherein the magnetron system (1) produces a magnetic field;

a measuring device (51, 58) for measuring a magnetic property of the layer; and a regulating device, coupled to the measuring device and the magnetron system (1), for adjusting an operating parameter of the magnetron system (1) as a function of the measured magnetic property to control the chemical composition of the layer.

13. The apparatus of claim 12, wherein the measuring device includes a Kerr magnetometer (51, 58, 54).

14. The apparatus of claim 13, wherein the Kerr magnetometer (51, 54, 58) measures the coercive field strength ($H_c$) of the layer.

15. The apparatus of claim 14, wherein the Kerr magnetometer includes a thermometer (58) for measuring the temperature of the layer.

16. The apparatus of claim 15, also including:

a data processing device (59) coupled to the Kerr magnetometer for determining the compensation temperature of the layer from the measured temperature and the measured coercive field strength of the layer.

17. The apparatus of claim 16, wherein the regulating device is coupled to the data processing device and to the magnetron system (1), and wherein the regulating device includes a means for storing a preset compensation temperature, comparing the preset compensation temperature with the compensation temperature, and changing said operating parameter of the magnetron system (1) upon determining that the compensation temperature differs from the preset compensation temperature.

18. The apparatus of claim 17, wherein the preset compensation temperature is substantially equal to the ambient temperature.

19. The apparatus of claim 12, wherein the magnetron system (1) includes a cathode (6, 7), and a means (18, 37) for applying a variable target voltage to the cathode, and means for varying the target voltage in response to variation of the magnetic field of the magnetron system (1).

20. The apparatus of claim 19, wherein the the cathode (6, 7) is a rectangular cathode having a longest axis, and wherein the substrate (4) is disk-shaped, and including:

a planar substrate carrier (2) for transporting the substrate (4) horizontally and perpendicularly to the longest cathode axis.

21. The apparatus of claim 20, wherein the magnetron system includes magnets (8, 9, 10), and a magnet lifting system (37) attached to the magnets (8, 9, 10), wherein the magnet lifting system is coupled to the regulating device so that the regulating device may control the magnet lifting system.

22. The apparatus of claim 21, wherein the regulating device includes a means (63) for storing a preset compensation temperature, comparing the preset compensation temperature with the measured magnetic property, and controlling the magnet lifting system in response to the result of said comparison.

23. The apparatus of claim 22, wherein the measurement device includes a means (50 through 62) for determining the compensation temperature of the layer, and wherein the regulating device adjusts the magnet lifting system upon determining that the compensation temperature differs from the preset compensation temperature.

24. The apparatus of claim 12, wherein the magnetron system (1) includes at least one sputtering cathode (6) and two permanent magnets (two of 8, 9, and 10), wherein a positive pole of one of the permanent magnets forms, with a negative pole of other of the permanent magnets, field lines which extend in the direction of the substrate (4), and wherein the measuring device (51, 58) detects a magnetic property at one point of the substrate (4), and wherein the regulating device controls both the distance of the permanent magnets from the substrate (4), and a voltage $U_K$ applied to the cathode, as a function of the measured magnetic property.

25. The apparatus of claim 24, including a regulatable current supply (18) for supplying the voltage $U_K$ to the cathode.

26. The apparatus of claim 12, wherein the magnetron system (1) also includes:
   a cathode plate (6) having a side from which said different chemical materials are sputtered onto the substrate;
   a magnet device (8, 9, 10, 12) adjacent the cathodes plate (6) for providing magnetic field lines which penetrate the cathode plate (6);
   a positioning device (37) connected to the magnet device for varying the distance between the cathodes plate (6) and the magnetic device (8, 9, 10, 12) for changing the magnetic field penetrating the cathode plate (6) without significantly varying other operating parameters of the magnetron system (1); and
   a means (18) for applying a variable cathode voltage ($U_K$) to the cathode plate, whereby said cathode voltage may be varied to compensate for erosion of the cathode plate, and to influence the magnetic behavior of the layer.

27. The apparatus of claim 12, wherein the magnetron system (1) includes:
   a cathode plate (6) having a longitudinal axis; and
   a pair of elongated sheet metal strips (21, 22) each having an axis oriented substantially parallel to the longitudinal axis of the cathode, said metal strips defining an aperture diaphragm (25) of variable size (S).

* * * * *